(12) United States Patent
Owen et al.

(10) Patent No.: US 11,688,562 B2
(45) Date of Patent: Jun. 27, 2023

(54) CAPACITOR COMPONENT FOR AN ELECTRIC MOTOR OR GENERATOR

(71) Applicant: PROTEAN ELECTRIC LIMITED, Franham (GB)

(72) Inventors: Geoffrey Owen, Farnham (GB); Gareth Roberts, Farnham (GB)

(73) Assignee: PROTEAN ELECTRIC LIMITED, Farnham (GB)

( * ) Notice: Subject to any disclaimer, the term of this patent is extended or adjusted under 35 U.S.C. 154(b) by 50 days.

(21) Appl. No.: 17/512,472

(22) Filed: Oct. 27, 2021

(65) Prior Publication Data
US 2022/0051855 A1 Feb. 17, 2022

Related U.S. Application Data

(63) Continuation of application No. 16/464,975, filed as application No. PCT/GB2017/053503 on Nov. 22, 2017, now abandoned.

(30) Foreign Application Priority Data

Nov. 30, 2016 (GB) ...................................... 1620270

(51) Int. Cl.
*H01G 4/40* (2006.01)
*H01G 4/224* (2006.01)
(Continued)

(52) U.S. Cl.
CPC .................. *H01G 4/40* (2013.01); *H01G 2/04* (2013.01); *H01G 2/106* (2013.01); *H01G 4/224* (2013.01);
(Continued)

(58) Field of Classification Search
CPC ............ H01G 4/248; H01G 4/38; H01G 4/40; H01G 2/106; H01G 4/224; H02K 2203/09; H02K 3/522; H02K 11/33
See application file for complete search history.

(56) References Cited

U.S. PATENT DOCUMENTS 7,046,498 B1 * 5/2006 Huang ..................... H01G 9/08
361/301.2
9,479,025 B2 * 10/2016 Kawata ................ B62D 5/0412
(Continued)

FOREIGN PATENT DOCUMENTS

CN 107507706 A * 12/2017

*Primary Examiner* — David M Sinclair
(74) *Attorney, Agent, or Firm* — Nolte Lackenbach Siegel

(57) ABSTRACT

A capacitor component comprising a first busbar, a second busbar, one or more capacitor elements and a housing, the housing having a first portion and a second portion, wherein the first portion and the second portion are arranged to extend around an aperture, the first portion includes a section for housing the one or more capacitor elements, with the second portion extending between a first end and a second end of the first portion, wherein the first busbar and the second busbar are arranged to extend around the first portion and the second portion of the housing, a first power supply terminal is formed at the first end of the first portion and a second power supply terminal is formed at the second end of the first portion, wherein the first power supply terminal is coupled to the first busbar and the second power supply terminal is coupled to the second busbar, wherein a first conductive layer of the one or more capacitor elements is coupled to the first busbar and a second conductive layer of the one or more capacitor elements is coupled to the second busbar.

17 Claims, 12 Drawing Sheets

(51) Int. Cl.
*H01G 2/10* (2006.01)
*H02K 11/33* (2016.01)
*H01G 2/04* (2006.01)
*H01G 4/38* (2006.01)
*H02K 11/00* (2016.01)
*H05K 7/14* (2006.01)
*H01G 2/08* (2006.01)
*H01G 4/248* (2006.01)
*H02K 3/52* (2006.01)

(52) U.S. Cl.
CPC ........... *H01G 4/38* (2013.01); *H02K 11/0094* (2013.01); *H02K 11/33* (2016.01); *H05K 7/1432* (2013.01); *H01G 2/08* (2013.01); *H01G 4/248* (2013.01); *H02K 3/522* (2013.01); *H02K 2203/09* (2013.01)

(56) References Cited

U.S. PATENT DOCUMENTS

2002/0171301 A1* 11/2002 Neri ................... H02P 1/42
    310/68 R
2015/0228411 A1* 8/2015 Owen ............... H02K 11/0094
    361/306.3

* cited by examiner

CAPACITOR COMPONENT FOR AN ELECTRIC MOTOR OR GENERATOR

This is a continuation of co-pending U.S. application Ser. No. 16/464,975 filed May 29, 2019, which is a U.S. National Stage Patent Application of PCT No. PCT/GB2017/053503, filed Nov. 22, 2017, claiming priority to GB Application No. 1620270.7, filed on Nov. 30, 2016, the entire contents of which are hereby incorporated by reference for all purposes, including the right of priority, as though fully set forth herein.

The present invention relates to a capacitor component, in particular a capacitor component for an electric motor or generator.

Electric motor systems typically include an electric motor and a control unit arranged to control the power of the electric motor. Examples of known types of electric motor include the induction motor, synchronous brushless permanent magnet motor, switched reluctance motor and linear motor. In the commercial arena three phase electric motors are the most common kind of electric motor available.

A three phase electric motor typically includes three coil sets, where each coil set is arranged to generate a magnetic field associated with one of the three phases of an alternating voltage.

To increase the number of magnetic poles formed within an electric motor, each coil set will typically have a number of coil sub-sets that are distributed around the periphery of the electric motor, which are driven to produce a rotating magnetic field.

By way of illustration, FIG. 1 shows a typical three phase electric motor 10 having three coil sets 14, 16, 18. Each coil set consists of four coil sub-sets that are connected in series, where for a given coil set the magnetic field generated by the respective coil sub-sets will have a common phase.

The three coil sets of a three phase electric motor are typically configured in either a delta or wye configuration.

A control unit for a three phase electric motor having a DC power supply will typically include a three phase bridge inverter that generates a three phase voltage supply for driving the electric motor. Each of the respective voltage phases is applied to a respective coil set of the electric motor.

A three phase bridge inverter includes a number of switching devices, for example power electronic switches such as Insulated Gate Bipolar Transistor (IGBT) switches, which are used to generate an alternating voltage from a DC voltage supply.

To reduce the effects of inductance on inverters when switching current, capacitors are used as a local voltage source for electric motor inverters. By placing a capacitor close to an inverter the inductance associated with the voltage source is minimised. Accordingly, for an electric motor having multiple inverters an annular capacitor ring is desirable to minimise the distance between the capacitor element and the inverters.

A capacitor needs to have a busbar to allow charge to flow to and from the capacitor plates.

However, an optimum busbar configuration may be inconsistent with the design needs for the capacitor and/or an electric motor or generator.

It is desirable to improve this situation

In accordance with an aspect of the present invention there is provided a capacitor component according to the accompanying claims.

The present invention provides the advantage of optimising current flow within a capacitor busbar while reducing inductance and optimising capacitor placement within an electric motor with improved space envelope utilisation.

The present invention will now be described, by way of example, with reference to the accompanying drawings, in which.

The embodiment of the invention described is for an electric motor having a capacitor component, where the electric motor is for use in a wheel of a vehicle. However the electric motor may be located anywhere within the vehicle. The motor is of the type having a set of coils being part of the stator for attachment to a vehicle, radially surrounded by a rotor carrying a set of magnets for attachment to a wheel. For the avoidance of doubt, the various aspects of the invention are equally applicable to an electric generator having the same arrangement. As such, the definition of electric motor is intended to include electric generator. In addition, some of the aspects of the invention are applicable to an arrangement having the rotor centrally mounted within radially surrounding coils. As would be appreciated by a person skilled in the art, the present invention is applicable for use with other types of electric motors.

Figure 1:
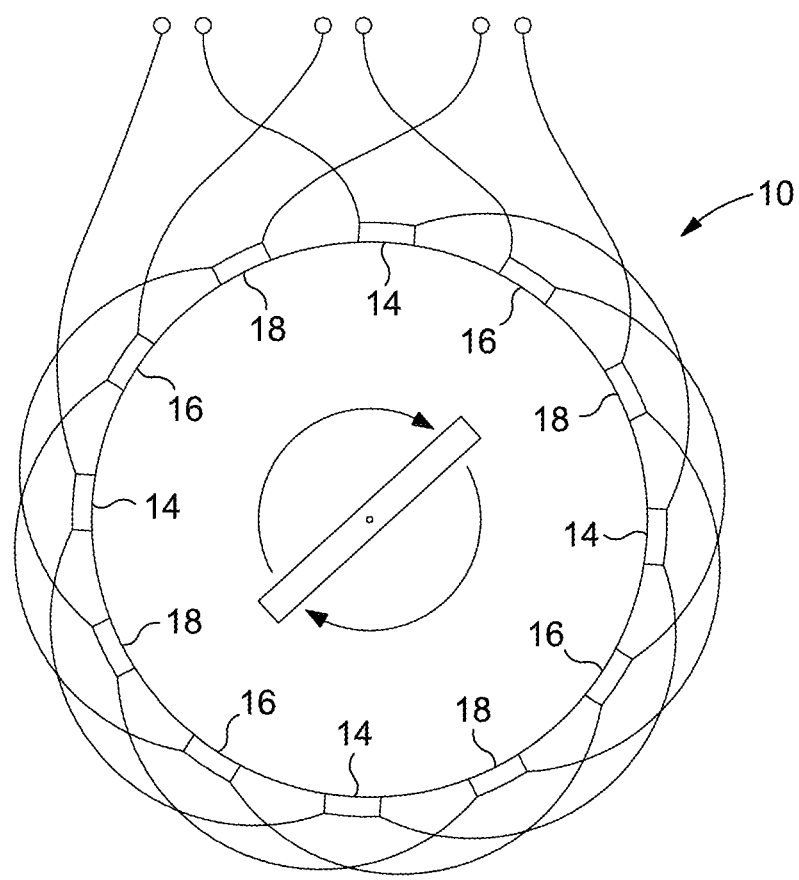
FIG. 1 illustrates a prior art three phase electric motor.
Figure 2:
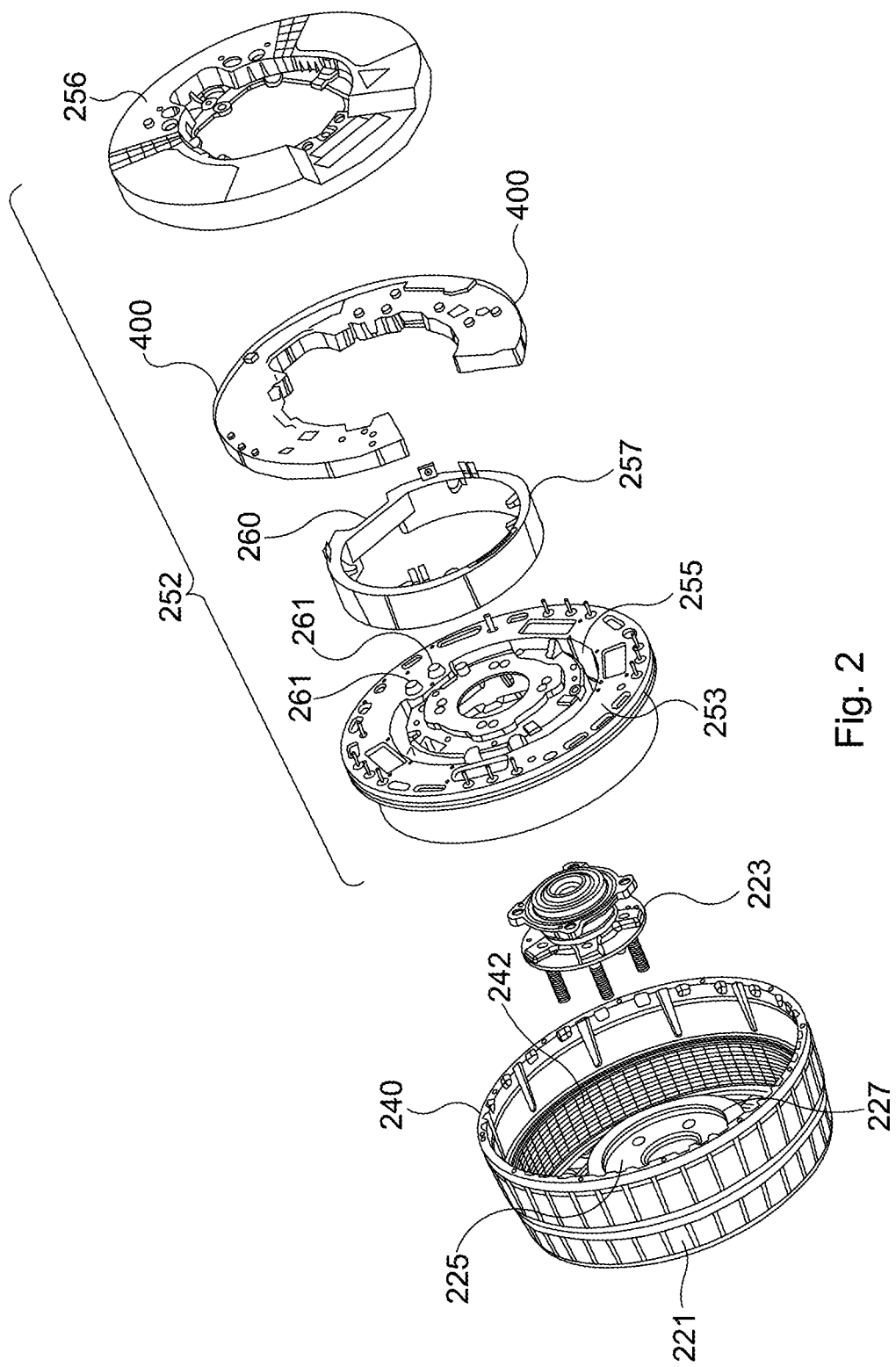
FIG. 2 illustrates an exploded view of a motor embodying the present invention.
Figure 3:
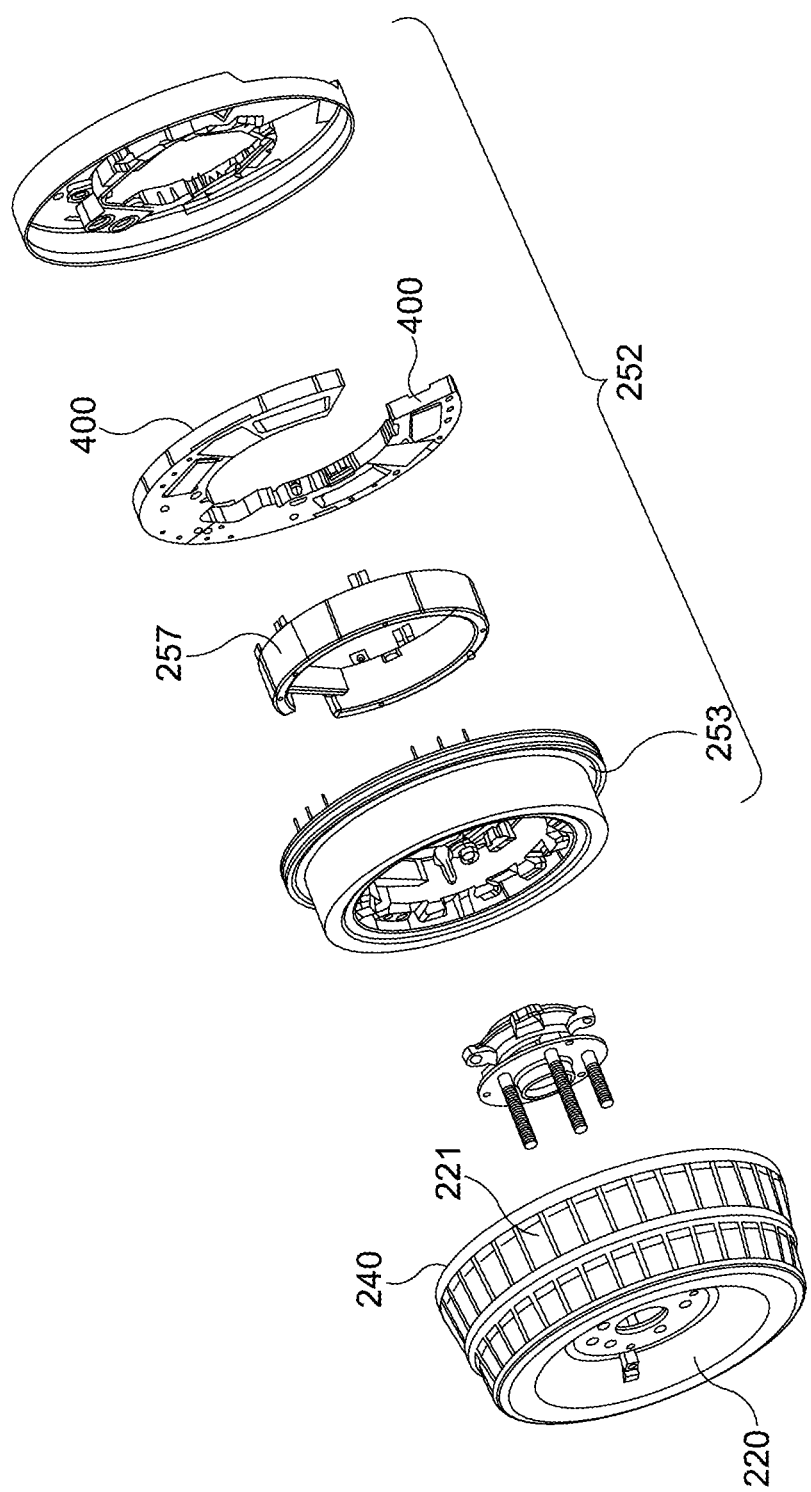
FIG. 3 illustrates an exploded view of the electric motor shown in FIG. 1 from an alternative angle.

For the purposes of the present embodiment, as illustrated in FIG. 2 and FIG. 3, the in-wheel electric motor includes a stator 252 comprising a heat sink 253, multiple coils (not shown), two control modules 400 mounted on the heat sink 253 on a rear portion of the stator for driving the coils, and a capacitor component 257 mounted on the stator within a recess 255 formed on the rear portion of the heat sink 253. In a preferred embodiment the capacitor component is substantially annular in shape. The coils are formed on stator tooth laminations to form coil windings, where the stator tooth laminations are mounted on the heat sink 253. The heat sink 253 includes at least one cooling channel for allowing a coolant to flow within the heat sink 253 for providing cooling, thereby allowing the heat sink 253 to extract heat from components attached to the heat sink 253, for example the coil windings, the capacitor component 257 and the control modules 400. A stator cover 256 is mounted on the rear portion of the stator 252, enclosing the control modules 400 to form the stator 252, which may then be fixed to a vehicle and does not rotate relative to the vehicle during use.

Figure 5:
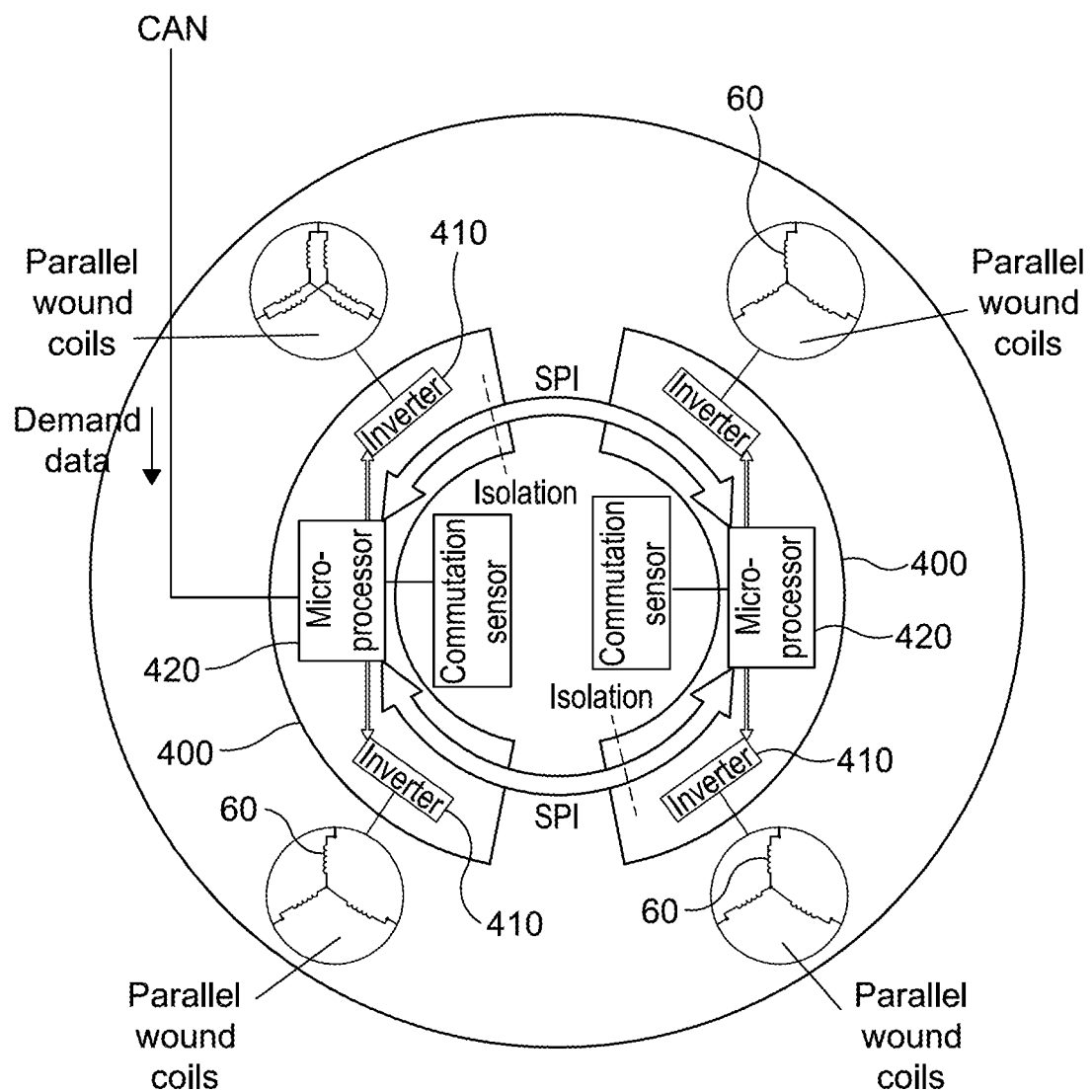
FIG. 5 illustrates control modules for an electric motor according to an embodiment of the present invention.

Each control module 400 includes two inverters 410 and control logic 420, which in the present embodiment includes a processor, for controlling the operation of the inverters 410, which is schematically represented in FIG. 5.

The capacitor component 257 is coupled across the inverters 410, as described below, for distributing the DC power supply to the inverters 410 and for reducing voltage ripple on the electric motor's power supply line, otherwise known as the DC busbar, during operation of the electric motor.

For reduced inductance the capacitor component 257 is mounted adjacent to the control modules 400. Although the capacitor component 257 within the electric motor of the present embodiment is substantially annular in shape, the capacitor element may take other forms.

As described below, the capacitor component 257 includes a section 260 that can be shaped to accommodate conduits, cables and other external features that need to be coupled to the electric motor without increasing the inductance of the capacitor component/electric motor configuration. Examples of conduits and cables include conduits 261 for providing cooling to the electric motor and/or electrical cabling that can include both cabling for providing a power supply to the electric motor and communications between the electric motor and an external controller.

A rotor 240 comprises a front portion 220 and a cylindrical portion 221 forming a cover, which substantially surrounds the stator 252. The rotor includes a plurality of permanent magnets 242 arranged around the inside of the cylindrical portion 221. For the purposes of the present embodiment 32 magnet pairs are mounted on the inside of the cylindrical portion 221. However, any number of magnet pairs may be used.

The magnets are in close proximity to the coil windings on the stator 252 so that magnetic fields generated by the coils interact with the magnets 242 arranged around the inside of the cylindrical portion 221 of the rotor 240 to cause the rotor 240 to rotate. As the permanent magnets 242 are utilized to generate a drive torque for driving the electric motor, the permanent magnets are typically called drive magnets.

The rotor 240 is attached to the stator 252 by a bearing block 223. The bearing block 223 can be a standard bearing block as would be used in a vehicle to which this motor assembly is to be fitted. The bearing block comprises two parts, a first part fixed to the stator and a second part fixed to the rotor. The bearing block is fixed to a central portion of the wall of the stator 252 and also to a central portion 225 of the housing wall 220 of the rotor 240. The rotor 240 is thus rotationally fixed to the vehicle with which it is to be used via the bearing block 223 at the central portion 225 of the rotor 240. This has an advantage in that a wheel rim and tyre can then be fixed to the rotor 240 at the central portion 225 using the normal wheel bolts to fix the wheel rim to the central portion of the rotor and consequently firmly onto the rotatable side of the bearing block 223. The wheel bolts may be fitted through the central portion 225 of the rotor through into the bearing block itself. With both the rotor 240 and the wheel being mounted to the bearing block 223 there is a one to one correspondence between the angle of rotation of the rotor and the wheel.

FIG. 3 shows an exploded view of the same motor assembly illustrated in FIG. 2 from the opposite side. The rotor 240 comprises the outer rotor wall 220 and circumferential wall 221 within which magnets 242 are circumferentially arranged. As previously described, the stator 252 is connected to the rotor 240 via the bearing block at the central portions of the rotor and stator walls.

The rotor also includes a set of magnets 227 for position sensing, otherwise known as commutation magnets, which in conjunction with sensors mounted on the stator allows for a rotor flux angle to be estimated. The rotor flux angle defines the positional relationship of the drive magnets to the coil windings. Alternatively, in place of a set of separate magnets the rotor may include a ring of magnetic material that has multiple poles that act as a set of separate magnets.

To allow the commutation magnets to be used to calculate a rotor flux angle, preferably each drive magnet has an associated commutation magnet, where the rotor flux angle is derived from the flux angle associated with the set of commutation magnets by calibrating the measured commutation magnet flux angle. To simplify the correlation between the commutation magnet flux angle and the rotor flux angle, preferably the set of commutation magnets has the same number of magnets or magnet pole pairs as the set of drive magnet pairs, where the commutation magnets and associated drive magnets are approximately radially aligned with each other. Accordingly, for the purposes of the present embodiment the set of commutation magnets has 32 magnet pairs, where each magnet pair is approximately radially aligned with a respective drive magnet pair.

A sensor, which in this embodiment is a Hall sensor, is mounted on the stator. The sensor is positioned so that as the rotor rotates each of the commutation magnets that form the commutation magnet ring respectively rotates past the sensor.

As the rotor rotates relative to the stator the commutation magnets correspondingly rotate past the sensor with the Hall sensor outputting an AC voltage signal, where the sensor outputs a complete voltage cycle of 360 electrical degrees for each magnet pair that passes the sensor.

For improved position detection, preferably the sensor includes an associated second sensor placed 90 electrical degrees displaced from the first sensor.

Figure 4:
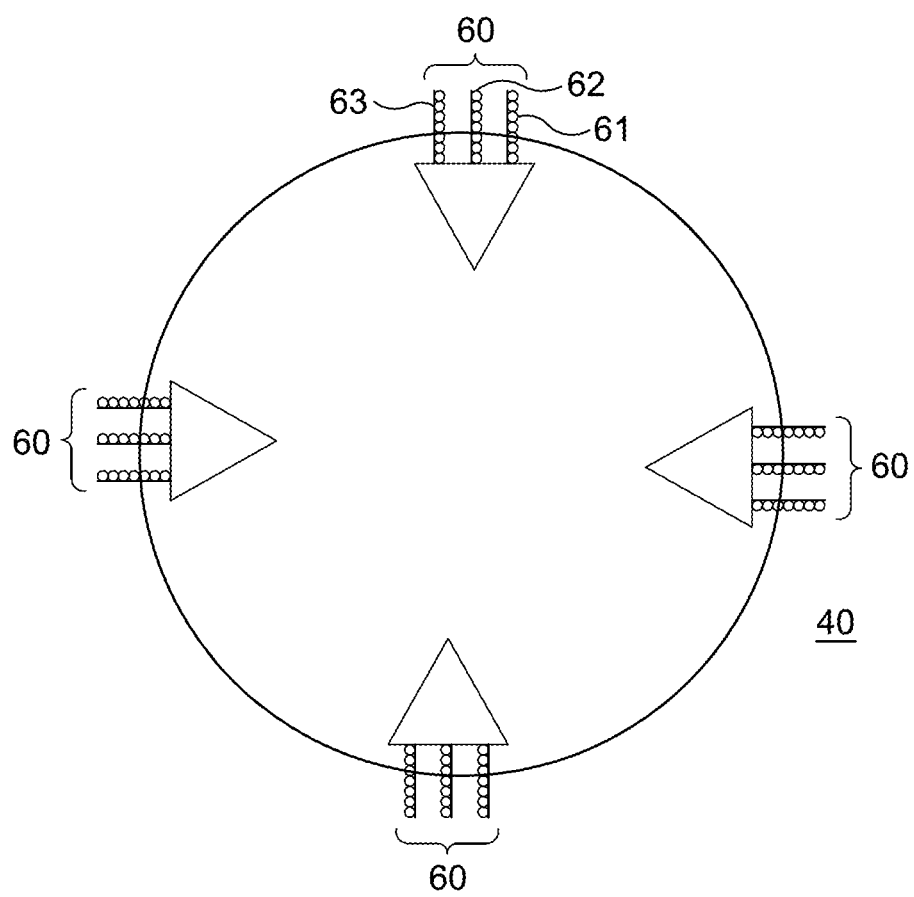
FIG. 4 illustrates an electric motor according to an embodiment of the present invention.

As illustrated in FIG. 4, in the present embodiment the electric motor includes four coil sets 60 with each coil set 60 having three coil sub-sets 61, 62, 63 that are coupled in a wye configuration to form a three phase sub-motor, resulting in the motor having four three phase sub-motors. The operation of the respective sub-motors is controlled via one of two control devices/control modules 400, as described below. However, although the present embodiment describes an electric motor having four coil sets 60 (i.e. four sub motors) the motor may equally have one or more coil sets with associated control devices. In a preferred embodiment the motor 40 includes eight coil sets 60 with each coil set 60 having three coil sub-sets 61, 62, 63 that are coupled in a wye configuration to form a three phase sub-motor, resulting in the motor having eight three phase sub-motors. Similarly, each coil set may have any number of coil sub-sets, thereby allowing each sub-motor to have two or more phases.

FIG. 5 illustrates the connections between the respective coil sets 60 and the control modules 400, where a respective coil set 60 is connected to a respective three phase inverter 410 included in a control module 400. As is well known to a person skilled in the art, a three phase inverter contains six switches, where a three phase alternating voltage may be generated by the controlled operation of the six switches. However, the number of switches will depend upon the number of voltage phases to be applied to the respective sub motors, where the sub motors can be constructed to have any number of phases.

Figure 6:
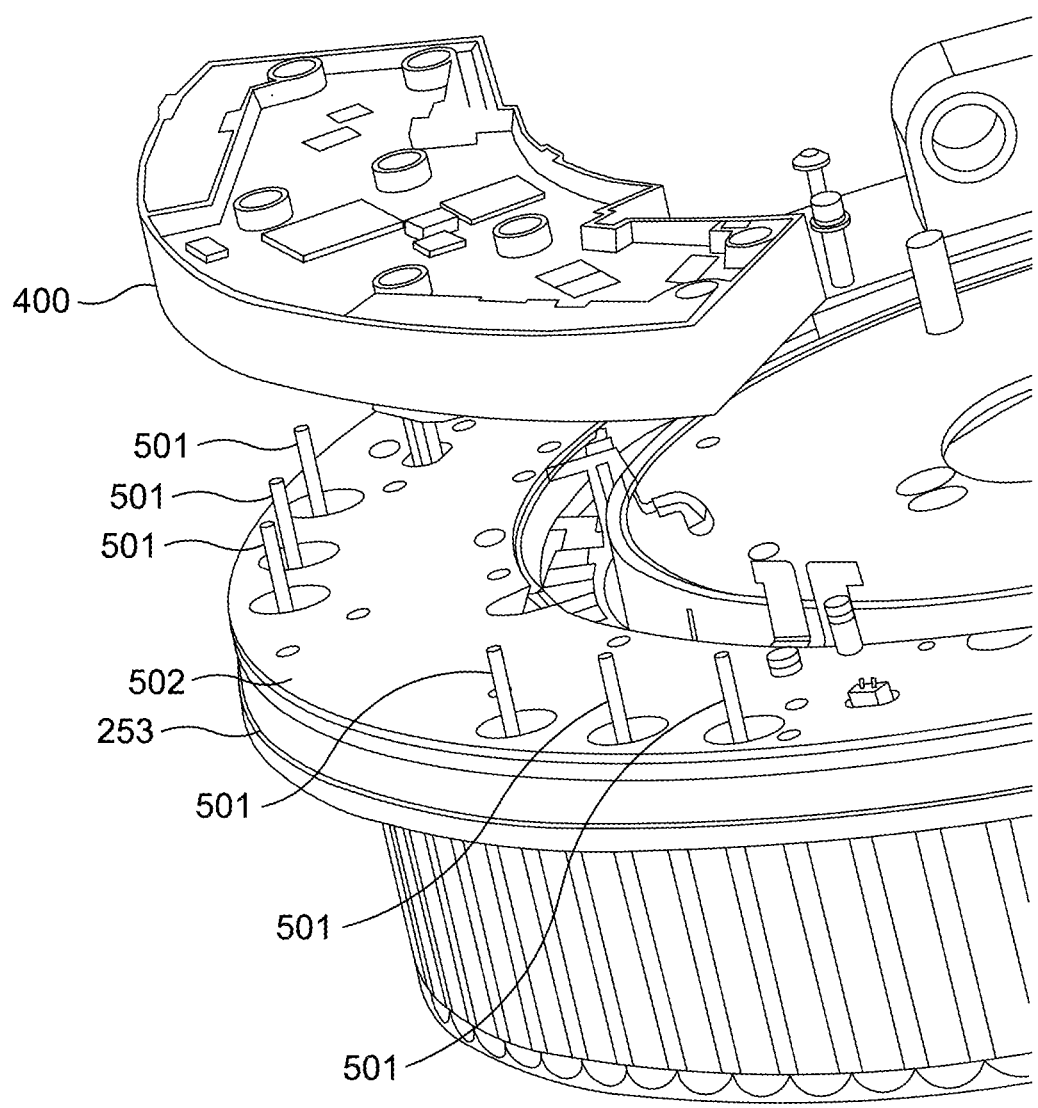
FIG. 6 illustrates a partial view for an electric motor according to an embodiment of the present invention.

The respective coils of the four coil sets are wound on individual stator teeth, which form part of the stator. The end portions 501 of the coil windings protrude through the planar rear portion 502 of the stator heat sink, as illustrated in FIG. 6. FIG. 6 illustrates a partial perspective view of the stator, where the end portions 501 of the coil windings for two of the four coil sets 60 extend away from the planar portion of the stator heat sink 253.

The control modules 400 are positioned adjacent to the planar portion of the stator heat sink 253, for mounting to the planar portion of the stator heat sink 253. For illustration purposes, a view of a single control module 400 separated from the stator heat sink 253 is shown in FIG. 6. As stated above, an annular recess 255 is formed in the planar portion of the heat sink 253 for housing the capacitor component.

For the purposes of the present embodiment, the planar portion of the heat sink 253 is located on the side of the stator that is intended to be mounted to a vehicle.

Preferably, to facilitate the mounting of the respective control modules 400 to the stator heat sink 253, the end sections 501 of the coil windings for the respective coil sets are arranged to extend away from the heat sink portion of the stator in a substantially perpendicular direction relative to the surface of the heat sink portion of the stator.

Figure 7:
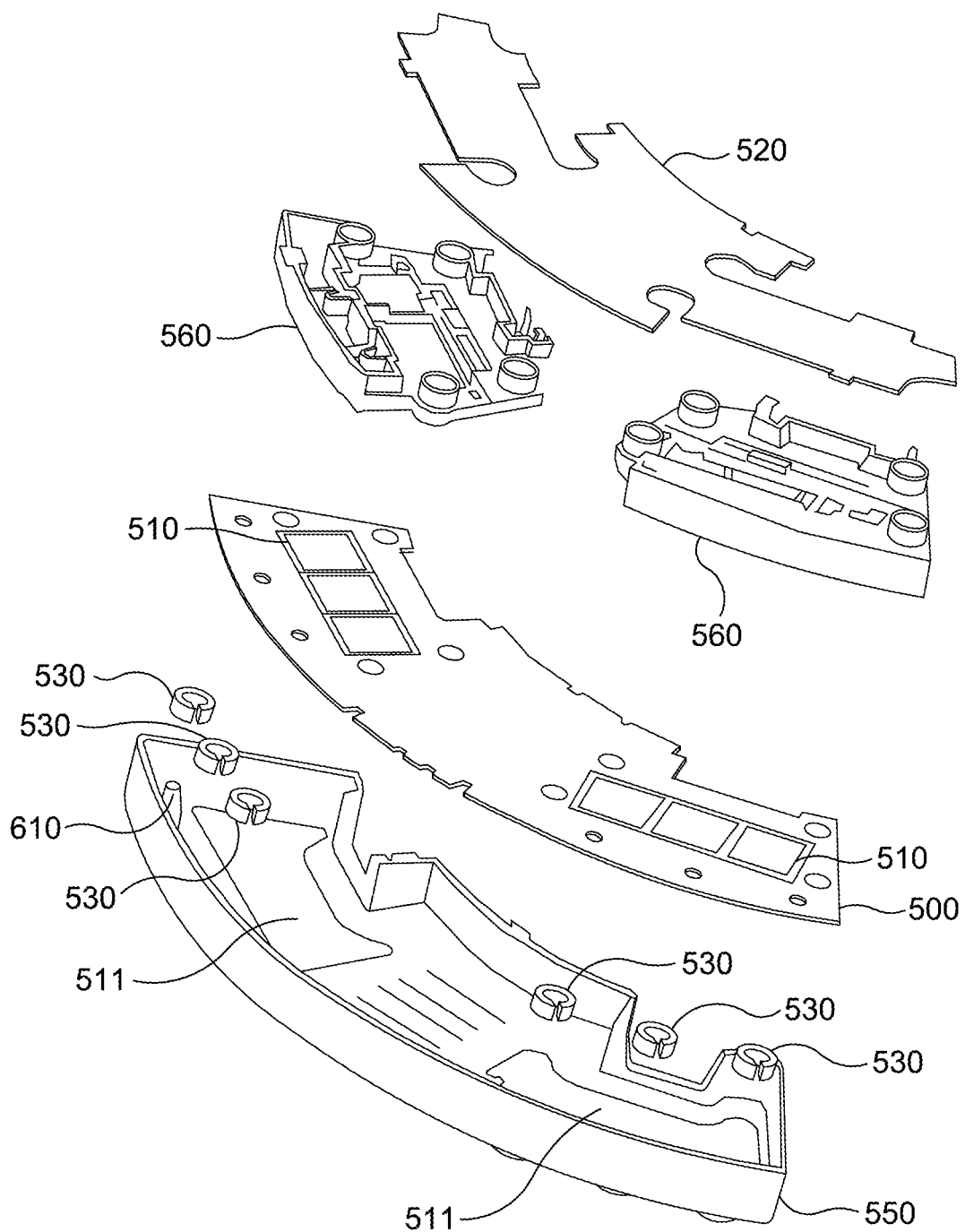
FIG. 7 illustrates a control module for an electric motor according to an embodiment of the present invention.

FIG. 7 illustrates a modular construction of the control module 400 with an exploded view of a preferred embodiment of a control module 400, where each control module 400, otherwise known as a power module, includes a power printed circuit board 500 in which are mounted two power substrate assemblies 510, a control printed circuit board 520, four power source busbars (not shown) for connecting to the capacitor component, six phase winding busbars (not shown) for connecting to respective coil windings, two insert modules 560 and six current sensors. Each current sensor includes a Hall sensor and a section of soft ferromagnetic material 530 arranged to be mounted adjacent to the Hall sensor, where preferably each Hall sensor is arranged to be mounted in a cutout section of a piece of soft ferromagnetic material fashioned in a toroid shape.

Each of the control module components are mounted within a control module housing 550 with the four power source busbars and the six phase winding busbars being mounted, via the respective insert modules, on the power printed circuit board 500 on opposite sides of the control device housing 550.

Each power substrate 510 is arranged to be mounted in a respective aperture formed in the power printed circuit board 500, where each of the power substrates 510 has a 3 mm copper base plate 600 upon which is formed a three phase inverter 410. A corresponding aperture 511 is also formed in the control module housing 550 to allow the copper base plate for each of the power substrates 510 is placed in direct contact with the stator heat sink 253 when the control device housing 550 is mounted to the stator, thereby allowing for cooling to be applied directly to the base of each of the power substrates 510.

Mounted on the underside of the power printed circuit board 500, adjacent to the copper base plate of the power substrate assemblies 510, are the six Hall sensors (not shown) for measuring the current in the respective coil windings associated with two of the four coil sets. The Hall sensor readings are provided to the control printed circuit board 520.

The power printed circuit board 500 includes a variety of other components that include drivers for the inverter switches formed on the power substrate assemblies 510, where the drivers are used to convert control signals from the control printed circuit board 520 into a suitable form for operating switches mounted on the power printed circuit board 500, however these components will not be discussed in any further detail.

The insert modules 560 are arranged to be mounted over the power printed circuit board 500 when the power printed circuit board 500 is mounted in the control module housing 550.

Each insert module 560 is arranged to be mounted over a respective power substrate assembly 510 mounted on the power printed circuit board 500, with each insert module 560 having an aperture arranged to extend around inverter switches formed on a respective power substrate assembly 510.

Each insert module 560 is arranged to carry two power source busbars and three phase windings busbars for coupling the inverter formed on the power substrate assembly 510, over which the insert module 560 is mounted, to the capacitor component and to the phase windings of a coil set, respectively.

The insert module 560 also acts as a spacer for separating the control printed circuit board 520 from the power printed circuit board 500 when both the power printed circuit board 500 and the control printed circuit board 520 are mounted in the control module housing 550.

A first pair of the power source busbars mounted on one of the insert modules 560 is for providing a voltage source to a first inverter 410 formed on one of the power substrates assemblies 510. A second pair of the power source busbars mounted on a second insert module 560 is for providing a voltage source to a second inverter 410 formed on the other power substrate assembly 510.

For each pair of power source busbars, one of the power source busbars is located in a first plane formed above the plane of the power circuit board 500. The other power source busbar is located in a second plane above the first plane. Preferably, each pair of power source busbars are arranged to be substantially co-planar.

Located in the control module housing 550 on the opposite side of the respective power substrate assemblies 510 to the power source busbars are the six phase winding busbars. A phase winding busbar is coupled to each inverter leg for coupling to a respective coil winding, as is well known to a person skilled in the art (i.e. a phase winding busbar is coupled to each leg of the three phase inverter formed on one of the power substrate assemblies 510 and a phase winding busbar is coupled to each leg of the three phase inverter formed on the other power substrate assembly 510).

The control printed circuit board 520 is arranged to be mounted in the control module housing 550 above the power printed circuit board 500.

The control printed circuit board 520 includes a processor 420 for controlling the operation of the respective inverter switches to allow each of the electric motor coil sets 60 to be supplied with a three phase voltage supply using PWM voltage control across the respective coil sub-sets 61, 62, 63. For a given torque requirement, the three phase voltage applied across the respective coil sets is determined using field oriented control FOC, which is performed by the processor on the control printed circuit board using the current sensors mounted within the control module housing 550 for measuring the generated current.

PWM control works by using the motor inductance to average out an applied pulse voltage to drive the required current into the motor coils. Using PWM control an applied voltage is switched across the motor windings. During the period when voltage is switched across the motor coils, the current rises in the motor coils at a rate dictated by their inductance and the applied voltage. The PWM voltage control is switched off before the current has increased beyond a required value, thereby allowing precise control of the current to be achieved.

The inverter switches can include semiconductor devices such as MOSFETs or IGBTs. In the present example, the switches comprise IGBTs. However, any suitable known switching circuit can be employed for controlling the current. One well known example of such a switching circuit is the three phase bridge circuit having six switches configured to drive a three phase electric motor. The six switches are configured as three parallel sets of two switches, where each pair of switches is placed in series and form a leg of the three phase bridge circuit. A DC power source is coupled across the legs of the inverter, with the respective coil windings of an electric motor being coupled between a respective pair of switches, as is well known to a person skilled in the art. A single phase inverter will have two pairs of switches arranged in series to form two legs of an inverter.

The three phase voltage supply results in the generation of current flow in the respective coil sub-sets and a corresponding rotating magnetic field for providing a required torque by the respective sub-motors.

Additionally, each control printed circuit board 520 includes an interface arrangement to allow communication between the respective control modules 400 via a communication bus with one control module 400 being arranged to communicate with a vehicle controller mounted external to the electric motor, where the externally mounted controller will typically provide a required torque value to the control module 400. The processor 420 on each control modules 400 is arranged to handle communication over the interface arrangement.

As stated above, although the present embodiment describes each coil set 60 as having three coil sub-sets 61, 62, 63, the present invention is not limited by this and it would be appreciated that each coil set 60 may have one or more coil sub-sets.

Figure 8:
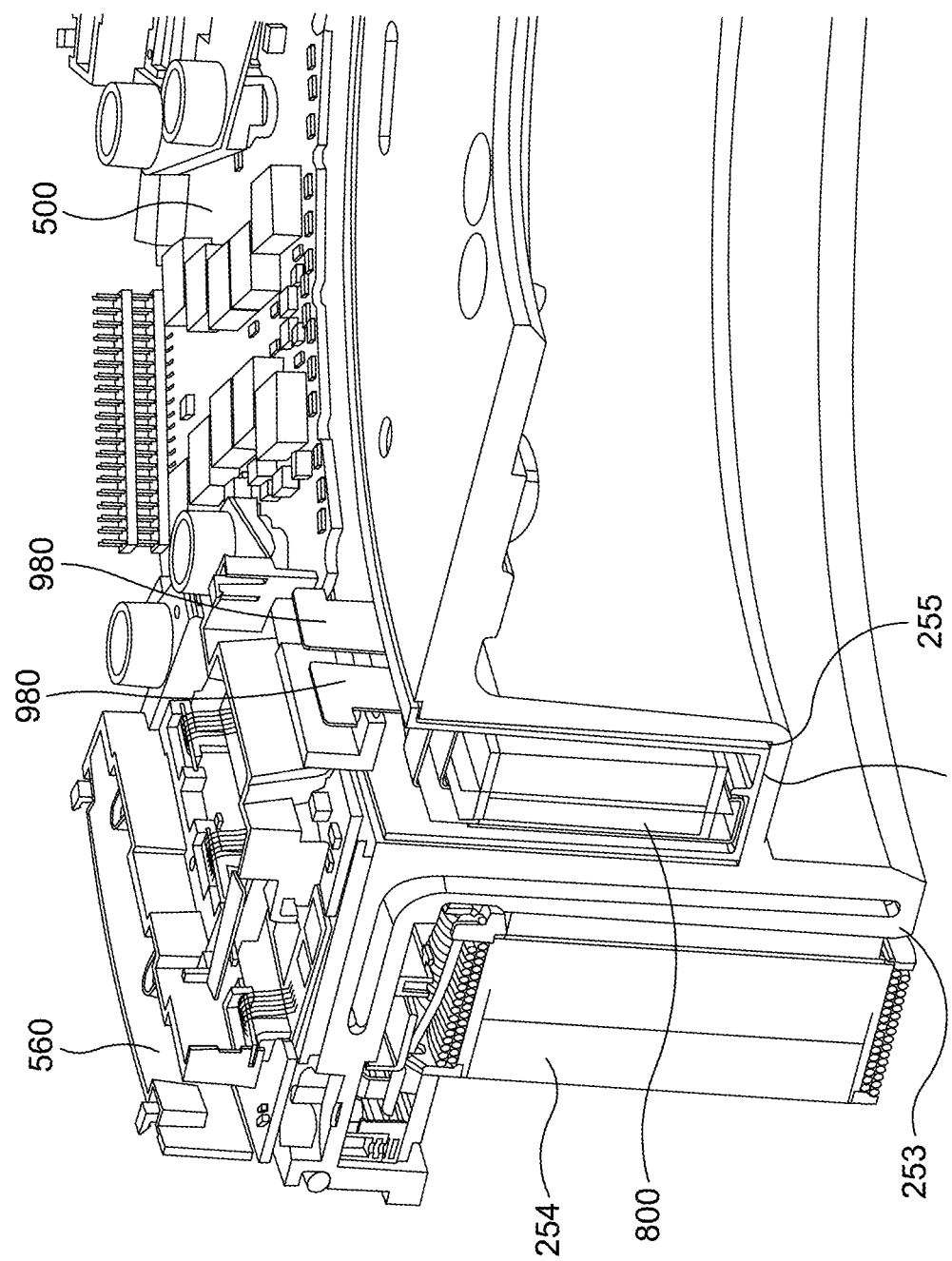
FIG. 8 illustrates a cross sectional view of a stator according to an embodiment of the present invention.

FIG. 8 illustrates a cross sectional view of a section of the stator with the capacitor component 800 being housed within a recess 255 formed in the planar portion of the heat sink 253.

The capacitor component 800 includes a first busbar, where the first busbar is coupled to a first internal capacitor electrode via a first external electrode. A second busbar mounted adjacent to the first busbar is coupled to a second internal capacitor electrode via a second external electrode, as described below. The first busbar allows charge to flow to and from the first internal capacitor electrode. The second busbar allows charge to flow to and from the second internal capacitor electrode. The first internal capacitor electrode and the second internal capacitor electrode correspond to the capacitor plates.

Figure 9:
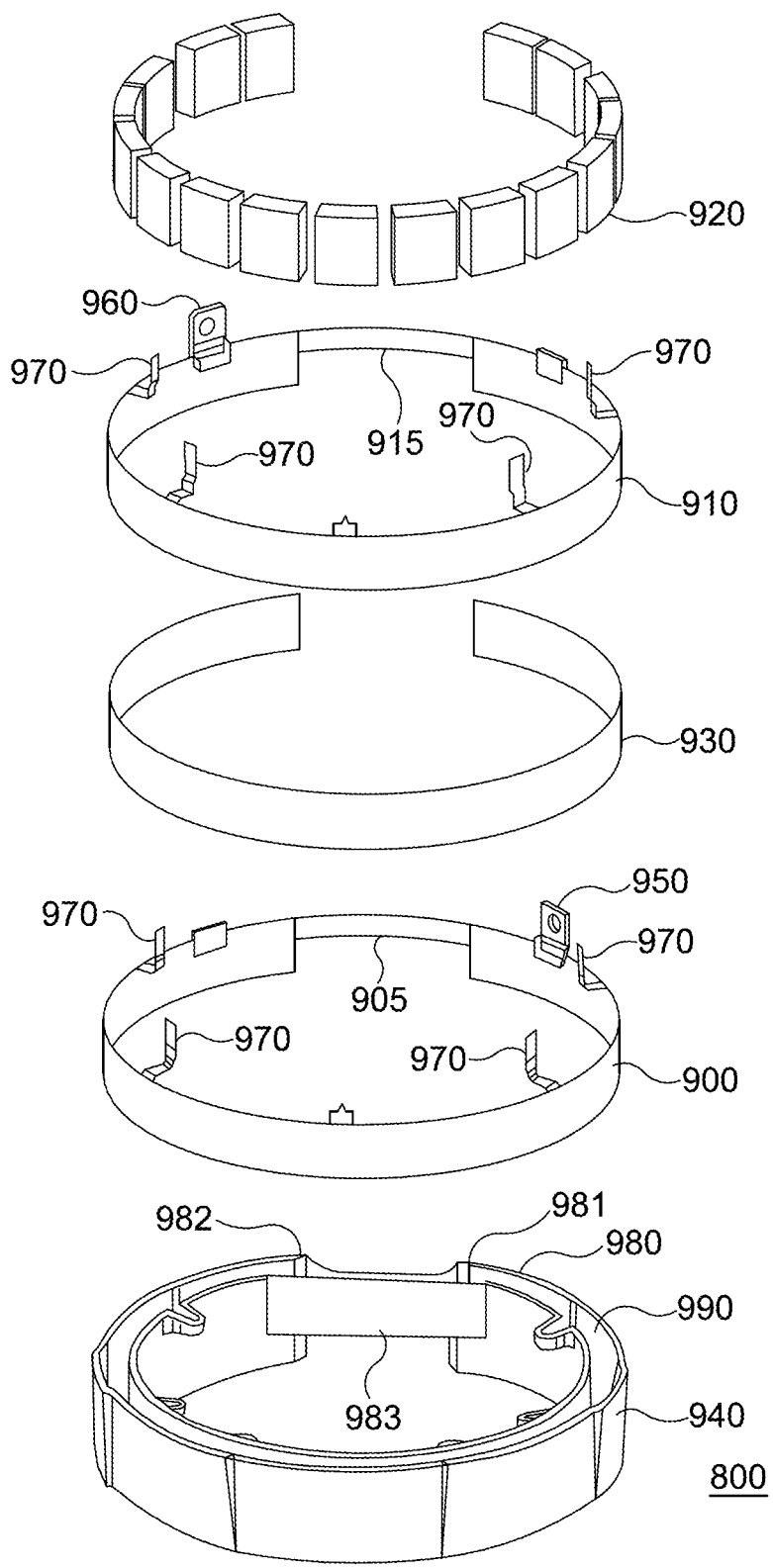
FIG. 9 illustrates a capacitor component according to an embodiment of the present invention.
Figure 10:
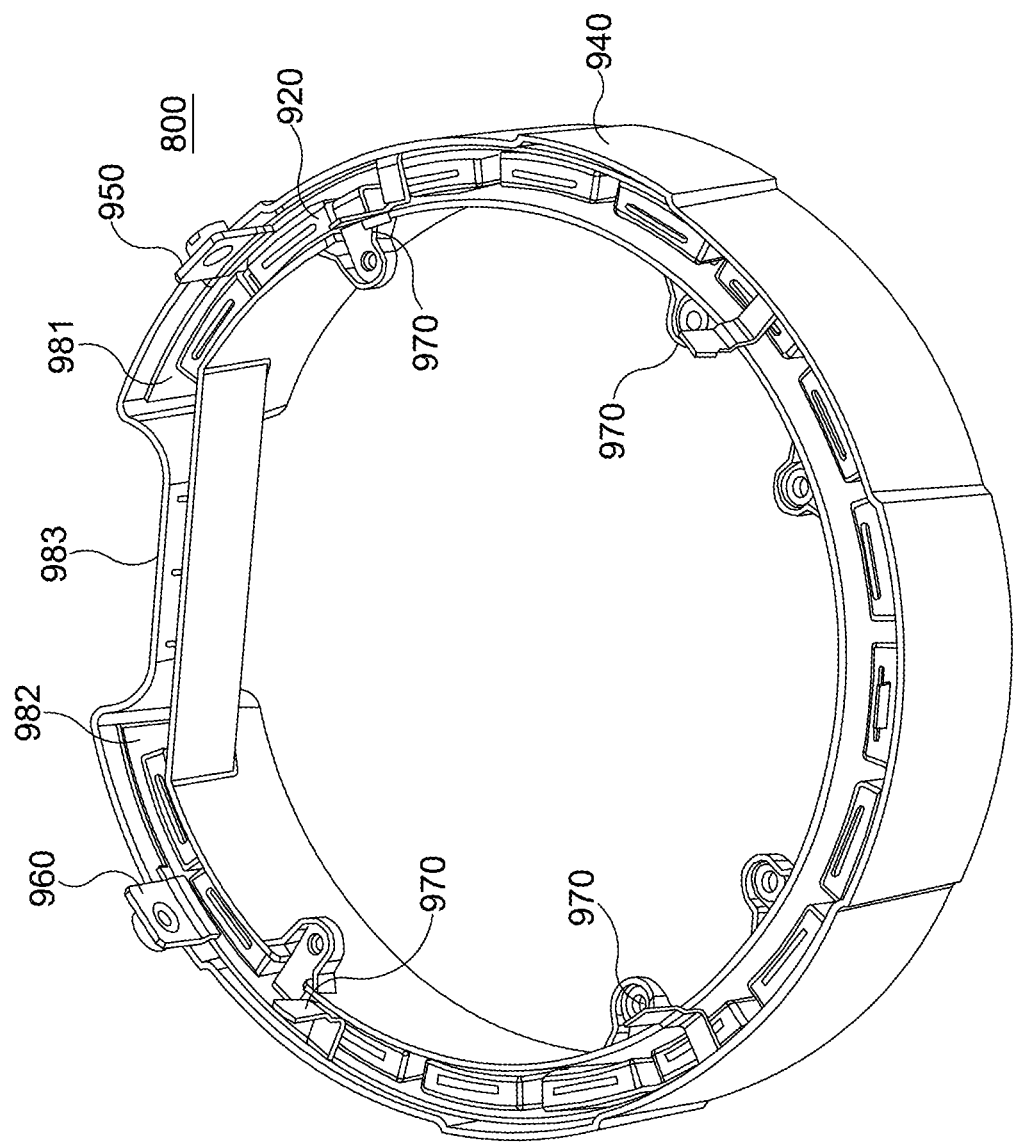
FIG. 10 illustrates a capacitor component according to an embodiment of the present invention.

FIG. 9 illustrates an exploded view of the capacitor component 800 with FIG. 10 illustrating a perspective view of the capacitor component 800. As illustrated in FIG. 9 both the first busbar 900 and the second busbar 910 are mounted around the outer surface of a plurality of capacitor elements 920 with the first busbar 900 and the second busbar 910 being separated by a first insulating film 930.

The first busbar 900, the second busbar 910, the plurality of capacitor elements 920, and the first insulating film 930 are arranged within a recess 990 formed within a housing 940, as described below.

The housing 940 has a first portion 980 that is arranged to house the first busbar 900, the second busbar 910, the plurality of capacitor elements 920, and the first insulating film 930. The first portion 980 of the housing 940 is configured as a section of an annular ring having a recessed section 990 for housing the first busbar 900, the second busbar 910, the plurality of capacitor elements 920, and the first insulating film 930.

The first portion of the housing has a first end section 981 and a second end section 982, where the first circumferential end section 981 and the second circumferential end section 982 are connected via a second portion 983 of the housing 940 that acts as a link between the respect end sections 981, 982 of the first portion 980.

The first busbar 900 includes a first busbar coupling element 905 that is mounted within the second portion 983 of the housing 940 to allow an electrical connection to be maintained between the regions of the first busbar 900 located at the first end section 981 and the second end section 982 of the housing 940.

Similarly, the second busbar 910 includes a second busbar coupling element 915 that is mounted within the second portion 983 of the housing 940 to allow an electrical connection to be maintained between the regions of the second busbar 910 located at the first end section 981 and the second end section 982 of the housing 940.

Having concentric busbars 900, 910 formed around the capacitor elements 920, where the busbars 900, 910 are separated by a thin insulation layer 930, rather than being placed on separate sides of the respective capacitor elements 920, minimises the inductance, thereby reducing losses in the inverter.

As no capacitor elements 920 are formed or mounted within the second portion 983 of the housing 940, the second portion 983 of the housing 940 can be designed to follow a different shape and/or configuration to the first portion 980 of the housing 940, thereby providing greater freedom for allowing the ingress of interface elements such as cabling and/or conduits into the electric motor without effecting the inductance of the electric motor/capacitor configuration while also allowing a more even distribution of current around the first busbar 900 and the second busbar 910, as described below.

For example, the second portion 983 of the housing 940, which as stated above corresponds to a section of the housing 940 encapsulating a section of the first busbar 900 and the second busbar 910 without capacitor elements, can be configured to extend around cooling conduits 261 and/or electrical cabling entering the motor, as illustrated in FIG. 2. Additionally, the second portion 983 can also be configured to avoid contact with other features of the electric motor, for example the bearing 223 that is mounted within the stator cavity. The second portion 983 of the housing 940 can be configured to have any suitable shape.

The first busbar 900 includes a first electrical coupling element 950 formed towards the first end section 981 region of the first portion of the housing. The first electrical coupling element 950 is used for coupling the first busbar 900 to a first terminal of a DC power source, for example a battery located within the vehicle housing the in-wheel electric motor. Similarly, the second busbar 910 includes a second electrical coupling element 960 formed towards the second end section 982 region of the first portion of the housing. The second electrical coupling element 950 is used for coupling the second busbar to a second terminal of the DC power source, thereby allowing the annular capacitor element to be coupled in parallel between the DC power source and the respective inverters mounted in the in-wheel electric motor.

Accordingly, the first electrical coupling element 905 and the second electrical coupling element 915 are coupled to the respective busbars 900, 910 on opposite sides of the second portion 983 of the housing 940.

Additionally, the first busbar 900 and the second busbar 910 include coupling members 970 for coupling to the respective inverter power source busbars mounted in the control modules 400 to allow the capacitor component 920 to act as a voltage source to each of the corresponding inverters, thereby allowing a single capacitor component to be used to support a plurality of inverters.

Maintaining an electrical connection on the first busbar 900 in the second portion 983 of the housing 940 allows an even distribution of current to flow from the first electrical coupling element 950 to the respective inverters coupled to the first busbar 900. By way of illustration, substantially half the current flow from/to the DC power source will flow in an anticlockwise direction on the first busbar 900 for providing current to the two inverters coupled to the first busbar 900 in the anticlockwise direction and half the current flow will flow through the first busbar coupling element 905 to the two inverters coupled to the first busbar 900 in the clockwise direction.

Similarly, maintaining an electrical connection on the second busbar 910 in the second portion 983 of the housing 940 allows an even distribution of current to flow from the second electrical coupling element 960 to the respective inverters coupled to the second busbar 910. By way of illustration, substantially half the current flow from/to the DC power source will flow in an clockwise direction on the second busbar 910 for providing current to the two inverters coupled to the second busbar 910 in the clockwise direction and half the current flow will flow through the second busbar coupling element 915 to the two inverters coupled to the second busbar 910 in the anticlockwise direction.

For example, if the current requirements for each of the inverters coupled to the first busbar 900 and the second busbar 910 is 100 Amps, in the above described configuration only 200 Amps needs to flow in the respective busbars in both a clockwise and an anticlockwise direction. In contrast, without the first busbar 900 having a first busbar coupling element 905 and the second busbar 910 having a second busbar coupling element 915 it would be necessary for 400 Amps to flow from the first coupling element 950 on the first busbar 900 in an anticlockwise direction with 400 Amps flowing from the second coupling element 960 in the second busbar 910 in a clockwise direction. Inductance can be calculated using the equation:

$$L = R\mu_0 \left[ \ln\frac{8R}{a} - 2 \right]$$

where a corresponds to the wire radius, R corresponds to the current loop radius, p corresponds to the magnetic permeability. Accordingly, if the current flow around the first busbar and the second busbar is in opposite directions the value for R will correspond to the radius of the first busbar and the second busbar. In contrast, if the current flow around the first busbar and the second busbar is in the same direction the value for R will correspond to the gap between the first busbar and the second busbar.

In one embodiment, the first busbar 900 and the second busbar 910 may be prefabricated annular sections that are push fit onto the recess portion of the first housing so that the busbars 900, 910 are concentric. However, to minimise the dimensional tolerances of the busbars 900, 910 and the risk of damage to the capacitor assembly that could result from thermal expansion, preferably at least one of the busbars 900, 910 are manufactured to have a section removed approximately opposite to the second portion 283 of the housing 940, where a section of each of the busbars 900, 910 is removed to allow for variations in the diameter of the annular capacitor component 920 resulting from manufacture and/or thermal expansion. Similarly, having a gap in the first busbar 900 and the second busbar 910 allows the busbars to expand/contract without causing stress to the surrounding components. The gap that is formed in the first busbar 900 and the second busbar 910 to form the C shaped busbars may be of any suitable size, however preferably the size of the gap will calculated using the coefficient of thermal expansion values of the materials used for the busbars and engineering manufacturing tolerances and component size to determine a gap size that will avoid the ends of the busbars coming into contact over the thermal envelope of the electric motor.

Preferably a first set of the plurality of capacitor elements 920 are arranged to perform a first capacitor function and a second set of the plurality of capacitor elements 920 are arranged to perform a second capacitor function.

The first set of capacitor elements are arranged to couple the DC voltage source to the respective inverters mounted in the control modules 400 on the electric motor, where the first set of capacitor elements are arranged to inhibit voltage transients generated across the inverter switches, which could cause losses and electrical stress on the switching devices and provide high pulse current loads from the inverter. This has the effect of reducing inductance on the inverters during current switching. The first capacitor element is coupled in parallel between the DC voltage source and the respective inverters.

To reduce electro-magnetic noise generated by the inverters, the second set of capacitor act as Y capacitor elements and are coupled in series with each other and in parallel with the first set of capacitor elements.

Y capacitors act as part of an EMC solution within an electric motor system, where Y capacitors are used in combination with a local DC link capacitor (i.e. the first capacitor) to reduce/control electromagnetic emissions by providing a path for common mode EMC currents to flow back to the DC link, thereby reducing the EMC currents flowing out of the motor.

For an electric motor having a plurality of sub-motors with associated inverters, typically two Y capacitors are required for each inverter. For a multi-inverter configuration this can have an adverse impact on packaging, cost and reliability of an electric motor system. However, the present invention allows a single Y capacitor configuration to support multiple inverters, thereby reducing packaging requirements and simplifying the manufacturing process.

Figure 11:
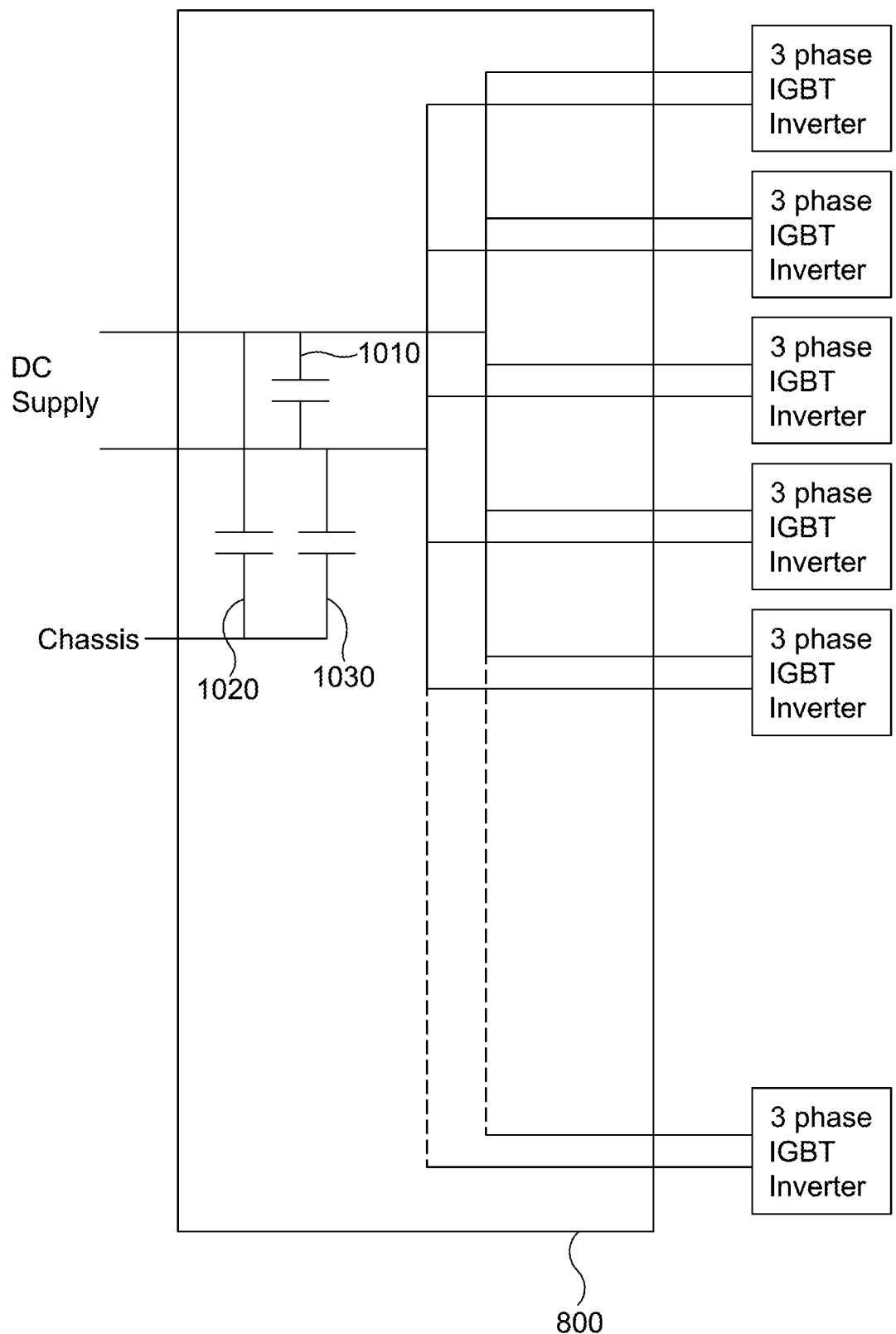
FIG. 11 illustrates a schematic diagram for a capacitor component according to an embodiment of the present invention.

FIG. 11 illustrates an equivalent circuit for the integrated capacitor component 800 with the first capacitor 1010 being coupled between the positive and negative power rails of the DC voltage source with the second capacitor 1020 being coupled between the positive power rail and a reference potential, for example the vehicle chassis, and the third capacitor 1030 being coupled between the negative power rail and the reference potential. As stated above, the respective inverters are coupled across the positive and negative power rails of the DC voltage source.

By placing a set of capacitor elements in close proximity to the plurality of separate inverters this has the effect of reducing inductive effects and removing the need for snubber capacitors.

Figure 12:
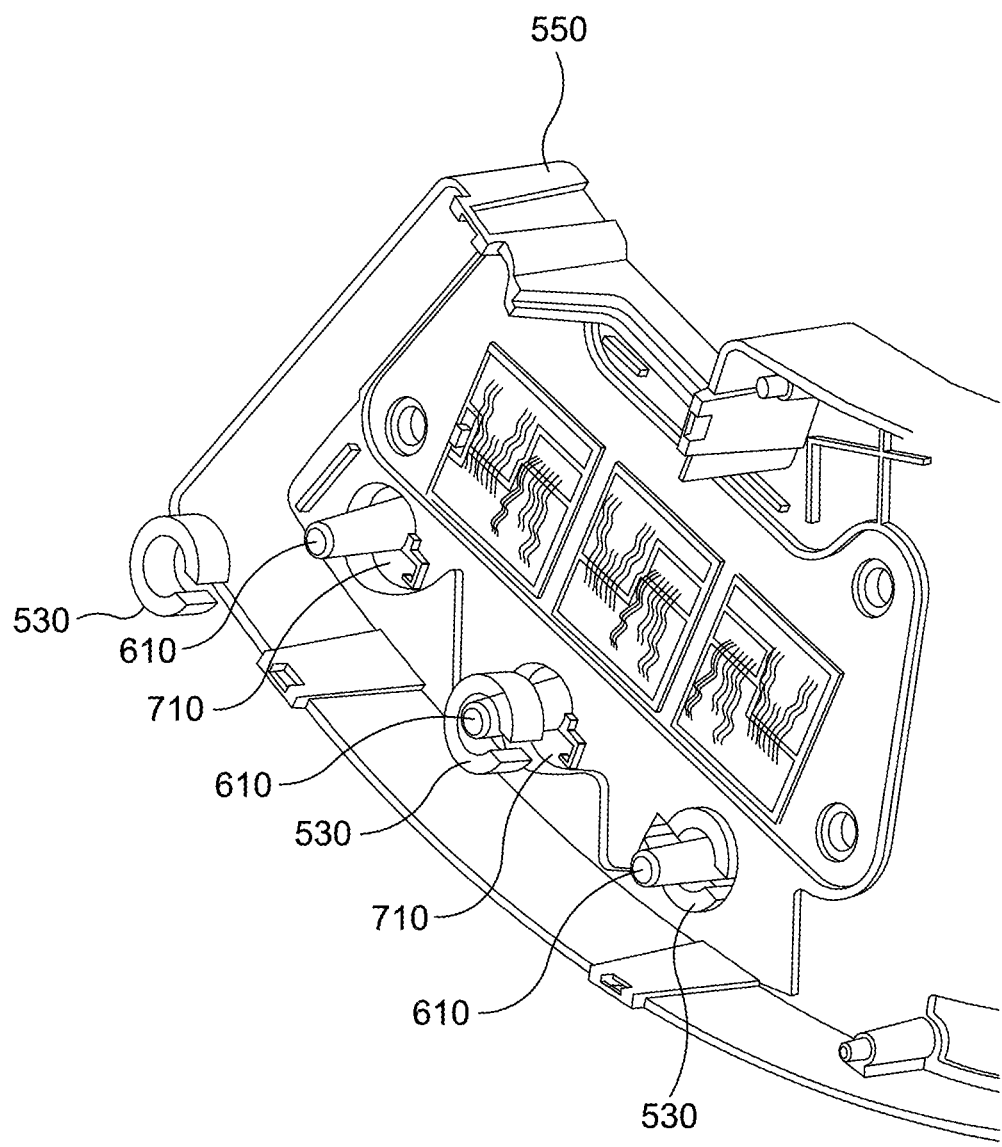
FIG. 12 illustrates a partial view of a control module housing according to an embodiment of the present invention.

To allow the respective coil windings for two of the four coil sets 60 to be coupled to a respective phase winding busbar within a control module housing 550, the control module housing 550 is arranged to have six apertures 610, see FIG. 12.

The six apertures 610 are formed on an outer edge of the control module housing 550 on the side of the housing 550 that is to be mounted adjacent to the planar portion of the stator heat sink 253.

The size and position of the six apertures 610 formed in the control module housing 550 are arranged to match the positions and diameters of the end portions of the coil windings that extend from the planar portion of the stator heat sink 253, thereby allowing the respective end portions of the coil windings to extend through the apertures 610 when the control housing module 550 is mounted on to the planar portion of the stator heat sink 253.

A partial perspective view of the control module housing 550 is illustrated in FIG. 16. A recess 710 is formed around each of the six apertures 610 formed in the control module housing 550, where each recess 710 is sized to allow a partial toroid made of soft ferromagnetic material 530, for example a ferrite element, to be located in the recess 710. The top of the partial toroid is arranged to be substantially level with the bottom section of the control module housing 550 when the partial toroid 530 is mounted in a recess 710. The partial toroid of ferromagnetic material 530 has a section missing from the toroid that substantially corresponds to the size of the Hall sensor mounted on the power printed circuit board 500. To facilitate the guiding of the coil windings as they pass through the aperture 610, the control module housing 550 is arranged to have a conduit section formed around each aperture 610. The conduit sections formed around each of the respective apertures also prevent an elastomer placed in the control module housing 550 from escaping through the apertures during the curing process for the elastomer.

Preferably the recesses 710 formed in the base of the control module housing 550 are keyed to ensure that the partial toroids of soft ferromagnetic material 530 can only be oriented within a recess 710 in a position where the missing section of the toroid is aligned with the position of the Hall sensor mounted on the power printed circuit board 500 when the power printed circuit board 500 is mounted within the control module housing 550.

Once the partial toroids of soft ferromagnetic material 530 have been mounted in the respective recesses 710 formed in the base of the control module housing 550, the power printed circuit board 500 is lowered into position in the control module housing. Upon the power printed circuit board 500 being lowered into position in the control module housing 550, as a result of the alignment of the partial toroids of soft ferromagnetic material 530 and the Hall sensors mounted on the power printed circuit board 500, the Hall sensors mounted on the power printed circuit board 500 are inserted into the missing sections of the respective partial toroids 530 mounted in the control module housing 550.

Once the power printed circuit board 500 has been lowered into position in the control module housing the insert modules are positioned over a respective power substrate assembly with the respective inverter formed on the power substrates being coupled to the respective power source busbars and phase winding busbars.

Each of the phase winding busbars formed on the respective insert modules are arranged to include a coupling section for coupling the phase winding busbar to a phase winding of one of the coil sets. The coupling section for each phase winding busbar is arranged to extend around a respective aperture 610 formed in the base of the control module housing 550.

The control printed circuit board 520 is then mounted in the control module housing 550 above the power printed circuit board 500, with the control printed circuit board 520 being electrically coupled to the power printed circuit board 500 to allow the control printed circuit board 520 to control the operation of the switches on the inverters formed on the power substrate assemblies 510.

To mount the control module 400 to the stator, the respective end sections of the coil windings form two coil sets 60 that extend away from the planar surface of the stator heat sink 253 (i.e. six coil winding end sections) are aligned with the respective apertures 610 formed in the base of the control module housing 550. The control module 400 is then pushed flush with the surface of the stator so that the respective end sections of the coil windings for two coil sets 60 that extend away from the planar surface of the stator heat sink 253 (i.e. six coil winding end sections) extend through the respective apertures 610 formed in the base of the control module housing 550 with each of the current sensors mounted in the control module 400 being mounted adjacent to a respective end section of a coil winding.

The control module may be mounted to the stator by any suitable means, for example one or more bolts that extend through the control module into the surface of the stator heat sink.

Once the control module has been mounted to the stator, the respective coupling sections of the phase winding busbars mounted on the power printed circuit board 500 are coupled to a respective end section of a coil winding, where any suitable means may be used to couple the coupling section of the phase winding busbar to a respective end section of a coil winding, for example crimping or welding. Similarly, the respective power source busbars housed in the control modules are coupled to respective coupling members on the first busbar and the second busbar using any suitable means, for example crimping or welding.

The inverter 410 formed on one power assembly 510, which is coupled via the respective phase winding busbars to a first coil set 60, is arranged to control current in the first coil set. The other inverter 410 formed on the other power assembly 510 in the control module 400 is arranged to control current in a second coil set 60, where the current measurements made by the respective current sensors are used by the processor on the control printed circuit board 520 to control current in the respective coil sets 60.

Similarly, the second control module 400 is arranged to control current in a third and fourth coil set 60.

The invention claimed is:

1. A capacitor component comprising:
   a first busbar,
   a second busbar,
   one or more capacitor elements, and
   a housing, the housing having a first portion and a second portion,
   wherein the first portion and the second portion are arranged to extend around an aperture, the first portion includes a section for housing the one or more capacitor elements, the first busbar, and the second busbar, with the second portion extending between a first end and a second end of the first portion, wherein the first busbar and the second busbar are housed within the second portion and arranged to extend around the first portion and the second portion of the housing and the one or more capacitor elements are not housed in the second portion, a first power supply terminal is formed at the first end of the first portion and a second power supply terminal is formed at the second end of the first portion, wherein the first power supply terminal is coupled to the first busbar and the second power supply terminal is coupled to the second busbar, wherein a first conductive layer of the one or more capacitor elements is coupled to the first busbar and a second conductive layer of the one or more capacitor elements is coupled to the second busbar.

2. A capacitor component according to claim 1, wherein the first busbar has a first section arranged to extend around the first portion of the housing and a second section arranged to extend around the second portion of the housing.

3. A capacitor component according to claim 1, wherein the second busbar has a first section arranged to extend around the first portion of the housing and a second section arranged to extend around the second portion of the housing.

4. A capacitor component according to claim 2, wherein the first busbar and/or the second busbar includes a gap in the first section of the first busbar and/or the second busbar.

5. A capacitor component according to claim 1, wherein the first busbar and the second busbar are separated by an insulating film.

6. A capacitor component according to claim 1, wherein a first subset of the plurality of capacitor elements corresponds to a first capacitor and a second subset of the plurality of capacitor elements corresponds to a Y capacitor, wherein the Y capacitor is arranged in series and in parallel to the first capacitor.

7. An electric motor or generator comprising:
a stator having two coil sets arranged to produce a magnetic field for generating a drive torque;
two control devices; and
a capacitor component comprising:
  a first busbar;
  a second busbar;
  one or more capacitor elements; and
  a housing having a first portion and a second portion, wherein the first portion and the second portion are arranged to extend around an aperture, the first portion includes a section for housing the one or more capacitor elements, the first busbar, and the second busbar, with the second portion extending between a first end and a second end of the first portion;
wherein the first busbar and the second busbar are housed within the second portion and arranged to extend around the first portion and the second portion of the housing and the one or more capacitor elements are not housed in the second portion, a first power supply terminal is formed at the first end of the first portion and a second power supply terminal is formed at the second end of the first portion;
wherein the first power supply terminal is coupled to the first busbar and the second power supply terminal is coupled to the second busbar;
wherein a first conductive layer of the one or more capacitor elements is coupled to the first busbar and a second conductive layer of the one or more capacitor elements is coupled to the second busbar;
wherein the capacitor component is arranged to be coupled to a power source for providing current to the two control devices;
wherein the first control device is coupled to a first coil set and the capacitor component and the second control device is coupled to a second coil set and the capacitor component; and
wherein each control device is arranged to control current in the respective coil set to generate a magnetic field in the respective coil set.

8. An electric motor or generator according to claim 7, wherein each coil set includes a plurality of coil sub-sets, wherein the first control device is coupled to the plurality of coil sub-sets for the first coil set and the second control device is coupled to the plurality of coil sub-sets for the second coil set and each control device is arranged to control current in the respective plurality of coil sub-sets to generate a magnetic field in each coil sub-set to have a substantially different magnetic phase to the other one or more coil sub-set in the respective coil set.

9. An electric motor or generator according to claim 7, wherein the first control device, the second control device and the capacitor component are mounted adjacent to the stator.

10. An electric motor or generator according to claim 7, wherein the stator includes an annular recess for housing the capacitor component.

11. An electric motor or generator according to claim 10, wherein the first control device and the second control device are mounted on the stator adjacent to the annular recess.

12. An electric motor or generator according to claim 10, wherein the first control device and the second control device are mounted on the stator between the outer radial edge of the stator and the annular recess.

13. An electric motor or generator according to claim 7, wherein the first control device includes a first inverter for controlling current flow in the first coil set and the second control device includes a second inverter for controlling current flow in the second coil set, wherein each inverter is coupled to the first capacitor.

14. An electric motor or generator according to claim 13, wherein the first inverter and the second inverter are mounted at substantially the same distance radially from the capacitor component.

15. An electric motor or generator according to claim 13, wherein the first inverter and second inverter are coupled to the first electrical busbar and the second electrical busbar.

16. An electric motor or generator according to claim 7, wherein the first portion of the housing forms a section of an annular ring and the second portion of the housing is arranged to extend around cooling conduits entering the electric motor or generator and/or cabling entering the electric motor or generator.

17. An electric motor or generator according to claim 7, wherein the first portion of the housing forms a section of an annular ring and the second portion of the housing is substantially straight.

* * * * *